United States Patent
Zhu et al.

(10) Patent No.: US 11,506,821 B2
(45) Date of Patent: Nov. 22, 2022

(54) OPTICAL ADHESIVE LAYER, STRETCHABLE DISPLAY DEVICE AND PREPARING METHOD FOR OPTICAL ADHESIVE LAYER

(71) Applicant: BOE Technology Group Co., Ltd., Beijing (CN)

(72) Inventors: Haibin Zhu, Beijing (CN); Xiaofen Wang, Beijing (CN); Jinxiang Xue, Beijing (CN); Zhongyuan Sun, Beijing (CN); Weijie Wang, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 259 days.

(21) Appl. No.: 16/880,219

(22) Filed: May 21, 2020

(65) Prior Publication Data

US 2021/0063610 A1    Mar. 4, 2021

(30) Foreign Application Priority Data

Aug. 30, 2019    (CN) .......................... 201910814248.4

(51) Int. Cl.
*G06F 3/038* (2013.01)
*G02B 1/14* (2015.01)
*G02B 1/12* (2006.01)
*G06F 1/16* (2006.01)
(Continued)

(52) U.S. Cl.
CPC ................. *G02B 1/14* (2015.01); *G02B 1/12* (2013.01); *G06F 1/1609* (2013.01); *G09F 9/301* (2013.01); *H01L 51/0097* (2013.01)

(58) Field of Classification Search
CPC .. G09F 9/301; G02B 1/12; G02B 1/14; G06F 1/1609; G06F 1/1652; H01L 51/0097; Y02E 10/549
See application file for complete search history.

(56) References Cited

U.S. PATENT DOCUMENTS

2012/0235315 A1* 9/2012 Wu ..................... H01L 51/003 264/255
2017/0147107 A1* 5/2017 Ishizaki ................ G06F 3/0445
2019/0041912 A1* 2/2019 Ha ......................... G06F 1/1652
(Continued)

FOREIGN PATENT DOCUMENTS

| CN | 103943544 A | 7/2014 | |
| CN | 105845702 A * | 8/2016 | ....... G02F 1/133305 |

(Continued)

OTHER PUBLICATIONS

First Office Action dated Jan. 6, 2021 corresponding to Chinese application No. 201910814248.4.

*Primary Examiner* — Joe H Cheng
(74) *Attorney, Agent, or Firm* — Nath, Goldberg & Meyer; Joshua B. Goldberg

(57) ABSTRACT

The present disclosure provides an optical adhesive layer, a stretchable display device and a preparing method for the optical adhesive layer. The optical adhesive layer includes: an edge region enclosing a hollow portion; a plurality of block regions distributed in the hollow portion along a first direction and a second direction; and connection ribs connecting the block regions to the edge region, wherein the connection ribs are distributed in the hollow portion in a net form.

15 Claims, 4 Drawing Sheets

(51) Int. Cl.
*G09F 9/30* (2006.01)
*H01L 51/00* (2006.01)

(56) References Cited

U.S. PATENT DOCUMENTS

2019/0073057 A1   3/2019  Ahn et al.
2019/0198801 A1*  6/2019  Kuon .................. H01L 51/5246
2021/0408161 A1* 12/2021  Sui ...................... H01L 27/3218

FOREIGN PATENT DOCUMENTS

| | | | |
|---|---|---|---|
| CN | 106129082 | A | 11/2016 |
| CN | 106448463 | A | 2/2017 |
| CN | 107274793 | A | 10/2017 |
| CN | 108735101 | A | 11/2018 |
| CN | 109326220 | A | 2/2019 |
| CN | 109326564 | A | 2/2019 |
| CN | 109523921 | A | 3/2019 |
| CN | 109559651 | A | 4/2019 |
| CN | 109830504 | A | 5/2019 |
| JP | 2011189623 | A | 9/2011 |
| KR | 20140032773 | A | 3/2014 |
| WO | WO-2018225895 | A1 * | 12/2018 ....... G02F 1/133305 |

\* cited by examiner preparing the optical adhesive layer by a printing process providing a film body with a preset thickness patterning the film body to form the optical adhesive layer, including patterning the film body by irradiating with UV light to form the optical adhesive layer

OPTICAL ADHESIVE LAYER, STRETCHABLE DISPLAY DEVICE AND PREPARING METHOD FOR OPTICAL ADHESIVE LAYER

CROSS-REFERENCE TO RELATED APPLICATION

The present application claims priority from Chinese patent application No. 201910814248.4 filed to China National Intellectual Property Administration (CNIPA) on Aug. 30, 2019, the disclosure of which is incorporated herein by reference.

TECHNICAL FIELD

The present disclosure relates to the field of display technologies, and particularly relates to an optical adhesive layer, a stretchable display device and a preparing method for an optical adhesive layer.

BACKGROUND

Organic light-emitting diodes (OLEDs) are considered to be one of the most promising display devices because of their advantages of wide viewing angle, simple processing technology, low power consumption, fast response, high light-emitting efficiency, thinness, small volume, wide temperature range, energy saving, environmental protection, capability of realizing flexible display, and the like.

Recently, to implement stretchable display, the OLED display has been prepared by forming a substrate with a flexible or elastic material. In current stretchable display devices, the substrate of the flexible or elastic material is typically designed to have a stretchable structure so that a certain stretching ratio can be achieved by stretching a hollow-out region by means of island (display unit) and bridge (circuit connection unit) connection.

In current stretchable display devices, in order to protect the flexible display substrate, a backing film is typically attached under a flexible TFT backplane for protection, and the two parts are adhered together by an Optical Clear Adhesive (OCA) Layer. However, in the stretchable display device based on this structure, when the display device is stretched, the deformation region and stress of the stretchable display device are mainly concentrated on the stretched edge, while the tension force and deformation inside the display device are very small, finally resulting in that the edge has excessive deformation and even is broken, while no stretching and deformation occurs inside the display screen, and thus leading to a very low stretching ratio in general. The main reason for this phenomenon is that the TFT backplane layer of the display substrate made of a PI material has the greatest elastic modulus, the backing film material has a medium elastic modulus, and the Optical Clear Adhesive (OCA) layer between the two has the smallest elastic modulus, i.e. has the highest flexibility and is most likely to be deformed. As a result, the OCA is deformed greatly in the stretched region and even rubbed, while the OCA inside the screen is not even stretched, thereby causing the problem that the patterned PI layer on the OCA layer is broken due to excessive local stress on the edge region, while no obvious stretching occurs in the interior.

SUMMARY

In an embodiment of the present disclosure, there is provided an optical adhesive layer, including:

an edge region enclosing a hollow portion;

a plurality of block regions distributed in the hollow portion along a first direction and a second direction; and connection ribs connecting the block regions to the edge region, wherein the connection ribs are distributed in the hollow portion in a net form.

Optionally, in the optical adhesive layer, end faces of the edge region and the block region facing a third direction are both located in a first plane, and an end face of the connection rib facing the third direction is located in a second plane, wherein the first plane protrudes from the second plane, and the third direction is perpendicular to the first direction and the second direction.

Optionally, in the optical adhesive layer, end faces of the edge region, the block region and the connection rib facing a fourth direction are all located in a third plane;

wherein the fourth direction is opposite to the third direction.

Optionally, in the optical adhesive layer, a distance between the second plane and the third plane is in the range of ½ to ⅘ of a distance between the first plane and the third plane.

Optionally, in the optical adhesive layer, the connection ribs include:

a plurality of first ribs disposed along the first direction, and a plurality of second ribs disposed along the second direction; wherein both ends of each of the first ribs and both ends of each of the second ribs are connected to the edge region, respectively, a plurality of the first ribs are intersected with a plurality of the second ribs to form a plurality of quadrilateral regions, wherein each of the quadrilateral regions is provided with a corresponding one of the block regions; and third ribs disposed in each of the quadrilateral regions for connecting the block regions with the first ribs and the second ribs that form the quadrilateral regions.

Optionally, in the optical adhesive layer, the third ribs connect the block region and the second ribs along the first direction, and connect the block region and the first ribs along the second direction.

Optionally, in the optical adhesive layer, at least a part of the third ribs extend to connect with the edge region in the quadrilateral region adjacent to the edge region.

Optionally, in the optical adhesive layer, the first rib, the second rib and the third rib each have a quadrilateral cross section, and a cross section width of the third rib is smaller than or equal to that of the first rib or the second rib.

Optionally, in the optical adhesive layer, the block region has a viscosity higher than the connection rib.

Optionally, in the optical adhesive layer, a cover material layer having a viscosity lower than the block region is provided on the end face of the connection rib facing the third direction.

In an embodiment of the present disclosure, there is further provided a stretchable display device, including any one of the optical adhesive layers as described above.

Optionally, in the stretchable display device, the stretchable display device further includes a display substrate and a backing film layer; and the optical adhesive layer connects the display substrate and the backing film layer;

wherein the display substrate includes a plurality of islands distributed at intervals and each provided with a pixel unit; and the islands are attached to the block regions in a one-to-one correspondence manner.

Optionally, in the stretchable display device, an orthographic projection of the block region on the island is located within the island.

Optionally, in the stretchable display device, the display substrate further includes connection regions connecting the plurality of islands, wherein an orthographic projection of each connection region in a plane of the optical adhesive layer is located on the connection rib, and a gap is present between the connection region and the connection rib.

In an embodiment of the present disclosure, there is further provided a preparing method for any one of the optical adhesive layers as described above, wherein the method includes:

preparing the optical adhesive layer by a printing process; or providing a film body with a preset thickness, and patterning the film body to form the optical adhesive layer.

Optionally, in the preparing method, the step of patterning the film body to form the optical adhesive layer includes:

patterning the film body by irradiating with UV light to form the optical adhesive layer.

DETAILED DESCRIPTION OF THE EMBODIMENTS

For clarity and better understanding of the technical problems to be solved, the technical solutions and advantages of the disclosure, the disclosure will be further described in detail in conjunction with the accompanying drawings and specific embodiments.

In order to solve the problem that in a stretchable display device, fracture caused by stress concentration occurs at an edge when the display device is stretched due to different elasticity moduli of the flexible display substrate, the OCA layer and the backing film, while the interior does not deform obviously, in an embodiment of the present disclosure, there is provided an optical adhesive layer, which designs a whole layer of plan optical adhesive layer in the conventional technology to include a plurality of separated block regions, the plurality of block regions are arranged in a hollow portion of the edge region, and connected to the edge region via connection ribs arranged in a net form, so that when a stretching force is applied on the edge region, it helps to transmit the tension force to the inner block regions, and to ensure uniform stress on each of the block regions, thereby avoiding the problem that fracture caused by stress concentration occurs at an edge during stretching, while the interior does not deform.

For clearly explaining the structure of the optical adhesive layer according to the embodiment of the present disclosure, a specific structure of a display device to which the optical adhesive layer according to the present disclosure is applied is first illustrated below.

Figure 1:
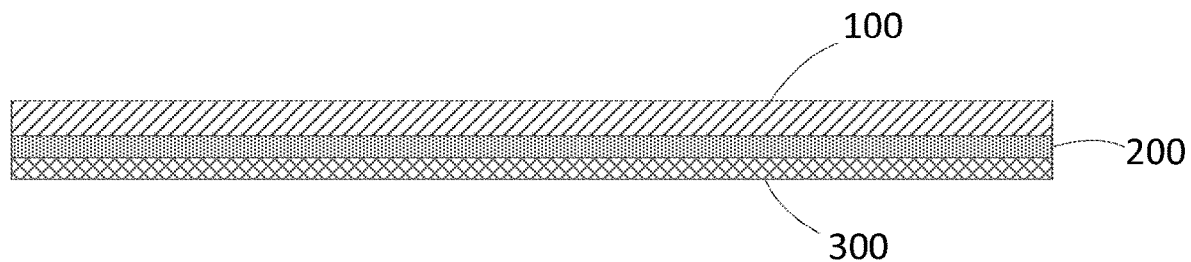
FIG. 1 is a schematic structural diagram of a cross section of a display device to which the optical adhesive layer according to an embodiment of the disclosure is applied.

FIG. 1 is a schematic structural diagram of a cross section of a display device to which the optical adhesive layer according to an embodiment of the disclosure is applied. Referring to FIG. 1, the display device includes a display substrate 100, an optical adhesive layer 200 and a backing film layer 300, wherein the display substrate 100 can be attached to the backing film layer 300 via the optical adhesive layer 200.

Figure 2:
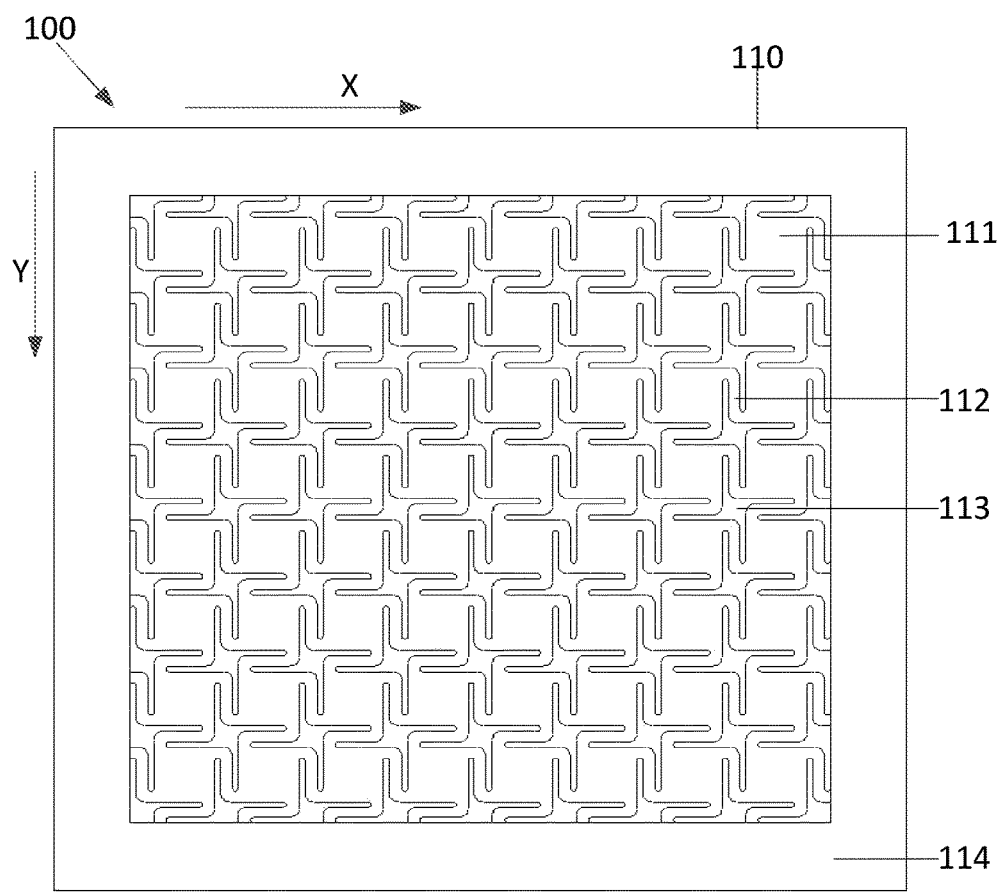
FIG. 2 is a schematic plan structure diagram of a display substrate in an optical adhesive layer according to an embodiment of the disclosure.

As shown in FIG. 2, the display substrate 100 includes a substrate body 110 made of a flexible material, the substrate body 110 being able to be twisted, bent, folded, and/or rolled, etc. Optionally, the substrate body 110 is made of a flexible organic material, such as polyimide, polyethylene terephthalate, or the like.

The substrate body 110 includes a plurality of islands 111 spaced apart from each other, a plurality of connection regions 112 connecting the plurality of islands 111, and penetration portions 113 penetrating the substrate body 110 between the plurality of connection regions 112.

Optionally, the plurality of islands 111 are repeatedly arranged along a first direction X and a second direction Y different from the first direction X to form a planar grid pattern. Optionally, the first direction X is perpendicular to the second direction Y, or the first direction X and the second direction Y form an obtuse angle or an acute angle therebetween. Optionally, to ensure the same stretching and displaying effect when stretching is performed in different directions, each of the islands 111 is connected to four connection regions 112 uniformly distributed on a periphery thereof, and each of the penetration portions 113 has four islands 111 uniformly distributed on a periphery thereof, each of the islands 111 being designed in the form of a symmetrical quadrangle, optionally a regular quadrangle.

Further, a thin film transistor and an OLED device are formed on each of the islands 111 so that each of the islands 111 is formed into a pixel unit region, that is, a pixel unit is disposed on the island 111 to produce the display substrate 100. Optionally, the prepared display substrate 100 may be any one of a top emission type, a bottom emission type, or a transparent display substrate.

In the prepared display substrate 100, all the pixel units are located on the islands 111, and traces connecting the pixel units are located on the connection regions 112.

With the above arrangement, a shape of the penetration portion 113 is changed as the substrate body 110 is stretched and bent by using the flexibility characteristics of the substrate body 110 so that a certain stretching ratio is achieved by the stretching and shape change of the penetration portion 113, thereby forming a stretchable display device.

In a display device with the above implementation structure, the backing film layer 300 may be, but not limited to, made of a polydimethylsiloxane (PDMS) material only, and the backing film layer 300 attached to the display substrate 100 can protect the pixel units on the display substrate 100.

The optical adhesive layer 200 is transparent and used for connecting the backing film layer 300 and the display substrate 100.

It should be noted that the display substrate with the structure shown in FIG. 2 is merely one implementation structure of the display substrate to which the optical adhesive layer of the present disclosure is applied, and does not constitute any limitation.

Figure 3:
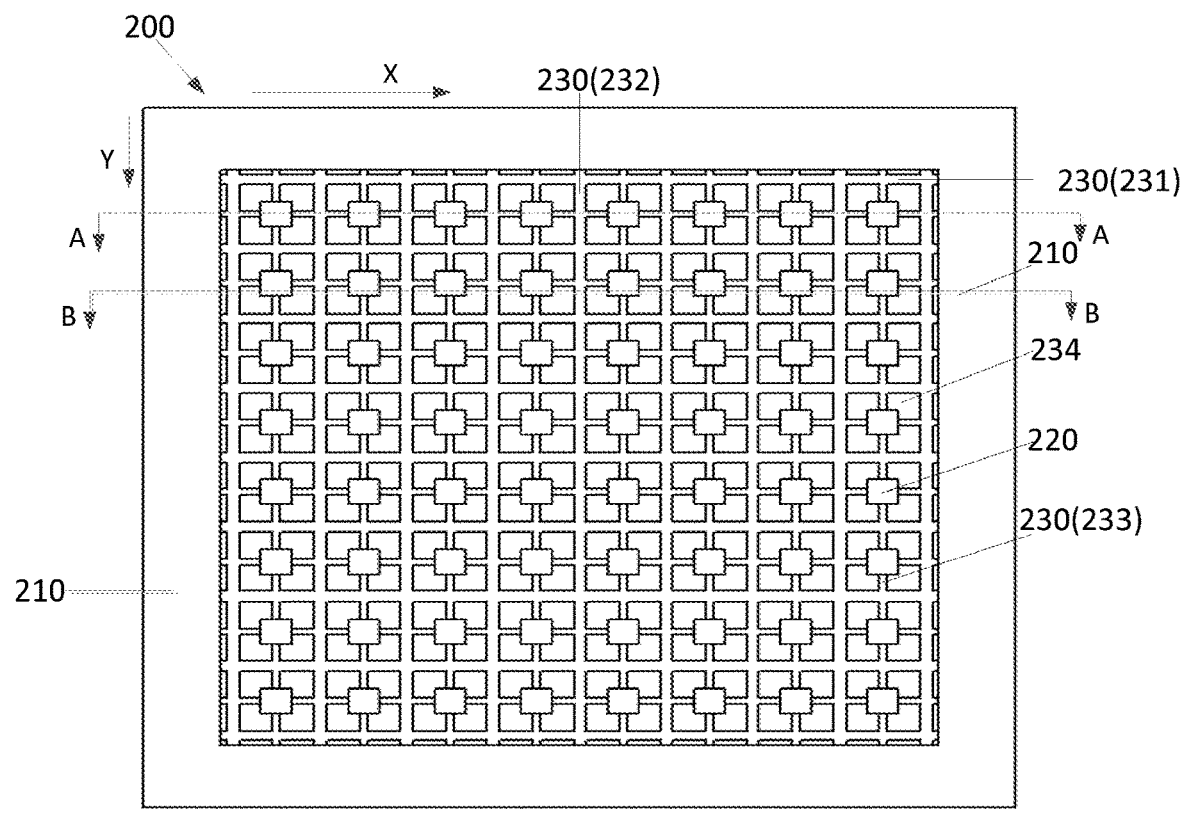
FIG. 3 is a schematic plan structure diagram of an implementation of an optical adhesive layer according to an embodiment of the disclosure.

One of the implementations of the optical adhesive layer 200 according to the embodiment of the disclosure is as shown in FIG. 3, including:

an edge region 210 enclosing a hollow portion;

a plurality of block regions 220 distributed in the hollow portion along a first direction X and a second direction Y; and connection ribs 230 connecting each of the block regions 220 to the edge region 210, wherein the connection ribs 230 are distributed in the hollow portion in a net form.

Figure 4:
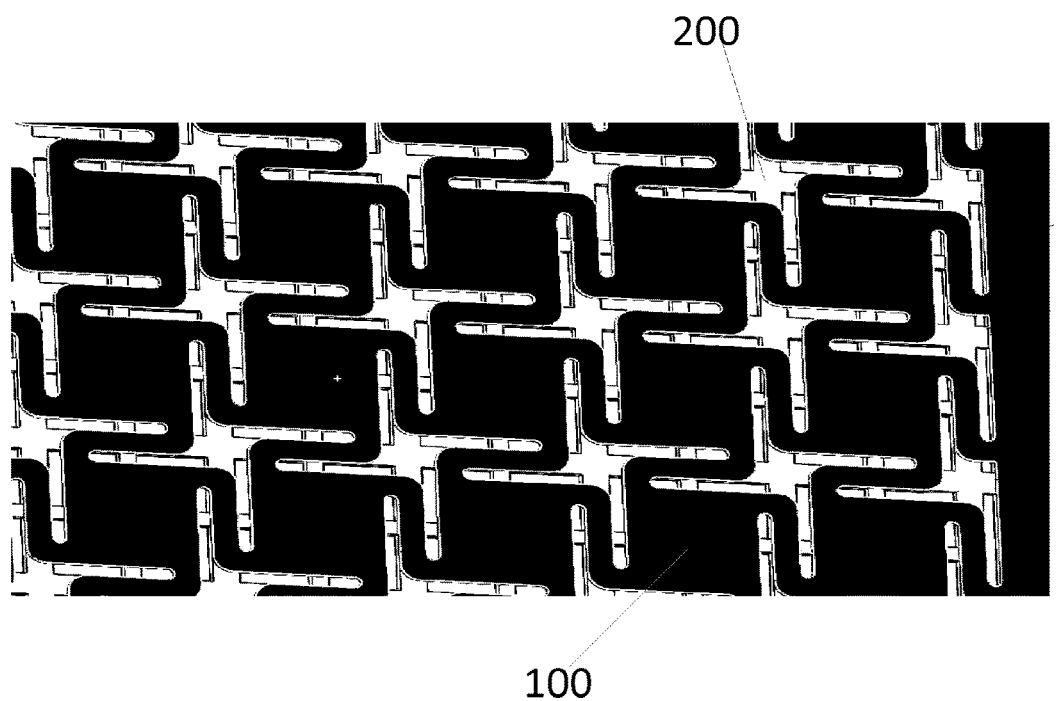
FIG. 4 is a partial schematic diagram showing an optical adhesive layer according to an embodiment of the disclosure attached to a display substrate.

In an embodiment of the present disclosure and with reference to FIGS. 2, 3 and 4, when the optical adhesive layer 200 connects the backing film layer 300 and the display substrate 100, the edge region 210 of the optical adhesive layer 200 is attached to a peripheral non-display region 114 (where no island 111 is disposed) of the display substrate 100, and the block regions 220 of the optical adhesive layer 200 are attached to the islands 111 of the display substrate 100 in a one-to-one correspondence manner. By adopting the optical adhesive layer with this implementation structure, the connection ribs 230 in a net form connecting the edge region 210 and the block regions 220 can reduce limitations by the optical adhesive layer to the connection regions 112 of the display substrate 100, and can transmit the tension force on the peripheral non-display region 114 of the display substrate 100 to the respective islands 111 uniformly, thereby ensuring uniform stress on the islands 111, and avoiding the problem that fracture caused by stress concentration occurs at an edge during stretching, while the interior does not deform.

It should be noted that, in an embodiment of the present disclosure, the hollow portion in the edge region 210 has a size approximately the same as the display region of the display substrate 100. Specifically, an orthographic projection of the display region of the display substrate 100 in a plane of the optical adhesive layer 200 is located in the hollow portion of the edge region 210.

Further, in an embodiment of the present disclosure, the block region 220 may have a quadrangle, and optionally a regular quadrangle shape. Obviously, the shape of the block region 220 is not limited to quadrangle, and may be a circle, an ellipse, a hexagon, or the like. In an embodiment of the present disclosure, the block region 220 has an area smaller than the island 111, and meanwhile, in order to ensure a good bonding effect between the block region 220 and the island 111, the block region 220 has an area at least greater than ⅓ of the area of the island 111.

Optionally, an orthographic projection of the block region 220 in a plane of the display substrate 100 is located within a corresponding island 111.

Figure 5:
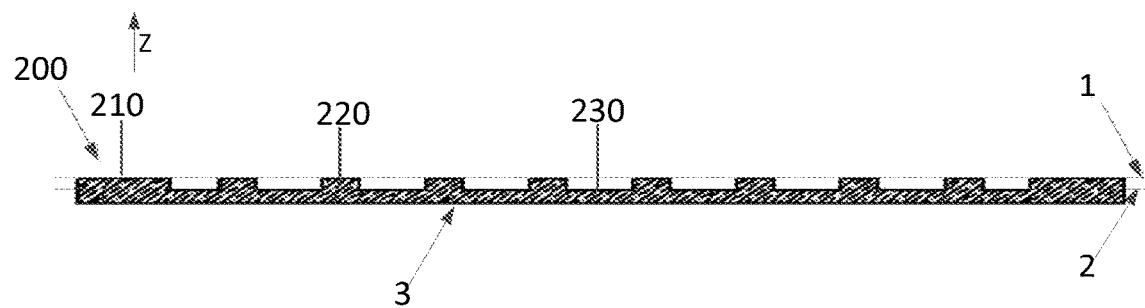
FIG. 5 is a schematic structural diagram along the section A-A in FIG. 3.
Figure 6:
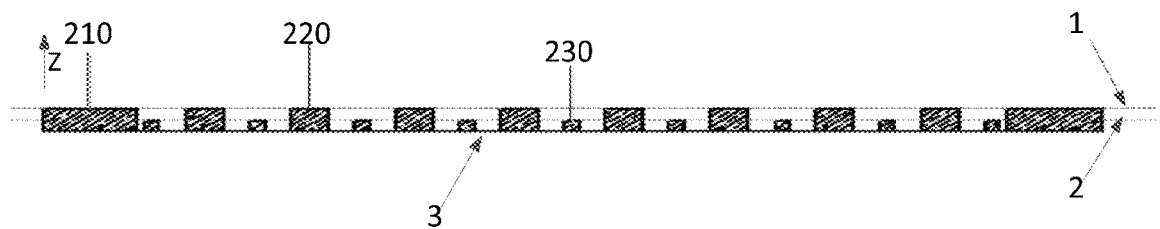
FIG. 6 is a schematic structural diagram along the section B-B in FIG. 3.

In an embodiment of the present disclosure, optionally, as shown in FIGS. 5 and 6, on the optical adhesive layer 200, end faces of the edge region 210 and the block region 220 facing a third direction Z are both located in a first plane 1, and an end face of the connection rib 230 facing the third direction Z is located in a second plane 2.

The second plane 2 is different from the first plane 1, the second plane 2 does not protrude from the first plane 1, and the third direction Z is perpendicular to the first direction X and the second direction Y. In other words, the first plane 1 protrudes from the second plane 2 in the third direction.

Based on the optical adhesive layer 200 with the above implementation structure and as shown in FIGS. 4 and 1, when the optical adhesive layer 200 connects the backing film layer 300 and the display substrate 100, the connection rib 230 corresponds to the connection region 112 of the display substrate 100, that is, an orthographic projection of the connection region 112 in a plane of the optical adhesive layer 200 is located on the connection rib 230.

when the optical adhesive layer 200 connects the backing film layer 300 and the display substrate 100, an end face of the optical adhesive layer 200 facing the third direction Z faces the display substrate 100 for connecting the display substrate 100. Specifically, since the end face of the edge region 210 of the optical adhesive layer 200 facing the third direction Z and the end face of the block region 220 facing the third direction Z are located in the same plane (the first plane 1), while the end face of the connection rib 230 facing the third direction Z (located in the second plane 2) is located in a plane different from the first plane 1 and the second plane 2 does not protrude from the first plane 1, a gap is formed between the connection rib 230 of the optical adhesive layer 200 and the connection region 112 of the display substrate 100 on the basis of ensuring that the edge region 210 of the optical adhesive layer 200 is attached to the peripheral non-display region 114 of the display substrate 100, and the block regions 220 of the optical adhesive layer 200 are attached to the islands 111 of the display substrate 100 in a one-to-one correspondence manner.

With the above implementation structure, a gap is formed between the connection rib 230 of the optical adhesive layer 200 and the connection region 112 of the display substrate 100, and only the block regions 220 are attached to the islands 111 in a one-to-one correspondence manner, so as to prevent the connection region 112 on the display substrate 100 for connecting the islands 111 from contacting the connection rib 230, and to facilitate free extension and retraction of the connection region 112 in the first direction X and the second direction Y. In addition, a deformation space for the connection region 112 in the third direction Z can be further ensured, so as to release the stress on the peripheral non-display region 114 of the display substrate 100 when being stretched, and increase a stretching amount of the display device, thereby avoiding restricting free extension and retraction of the connection region 112 by the whole layer of plan optical adhesive layer in the conventional technology due to the adhesive connection of the connection region 112, and fracture of the connection region 112 due to excessive local deformation.

Referring to FIGS. 5 and 6, in the optical adhesive layer 200 according to the embodiment of the disclosure, end faces of the edge region 210, the block region 220 and the connection rib 230 facing a fourth direction are all located in a third plane 3, where the fourth direction is opposite to the third direction Z.

Specifically, when the optical adhesive layer 200 connects the backing film layer 300 and the display substrate 100, an end face of the optical adhesive layer 200 facing the fourth direction faces the backing film layer 300 for connecting the backing film layer 300. Since end faces the edge region 210, the block region 220, and the connection rib 230 of the optical adhesive layer 200 facing the fourth direction are located in the same plane, the entire plane of the backing film layer 300 can be bonded to the optical adhesive layer 200, so as to ensure connection stability between the backing film layer 300 and the display substrate 100.

In an embodiment of the present disclosure and with reference to FIGS. 5 and 6, a distance between the first plane 1 and the third plane 3 is greater than a distance between the second plane 2 and the third plane 3. Optionally, the distance between the second plane 2 and the third plane 3 is in the range of ½ to ⅘ of the distance between the first plane 1 and the third plane 3.

With the above implementation structure, the connection rib 230 has a height lower than the block region 220 which ensures that the connection region 112 of the display substrate 100 is not in contact with the connection rib 230 of the optical adhesive layer 200, so as to facilitate free extension and retraction of the connection region 112 of the display substrate 100 in the XY horizontal plane, and which also ensures that connection region 112 has a deformation space in the Z direction, so as to greatly release the stress, increase a stretching amount of the stretchable display device, and avoid restricting free extension and retraction of the connection region 112 when an optical adhesive layer with a conventional whole plane structure is bonded to the connection region 112, while avoiding the situation that the connection region 112 in the optical adhesive layer is broken due to excessive local deformation.

In addition, since end faces of the edge region 210 and the block region 220 in the optical adhesive layer 200 facing the third direction Z are located in the same plane (the first plane 1), that is, at the same height, a good bonding state is ensured between the edge region 210/block region 220 and the display substrate 100 when the optical adhesive layer is attached to the display substrate 100.

Figures 7, 8, 9:
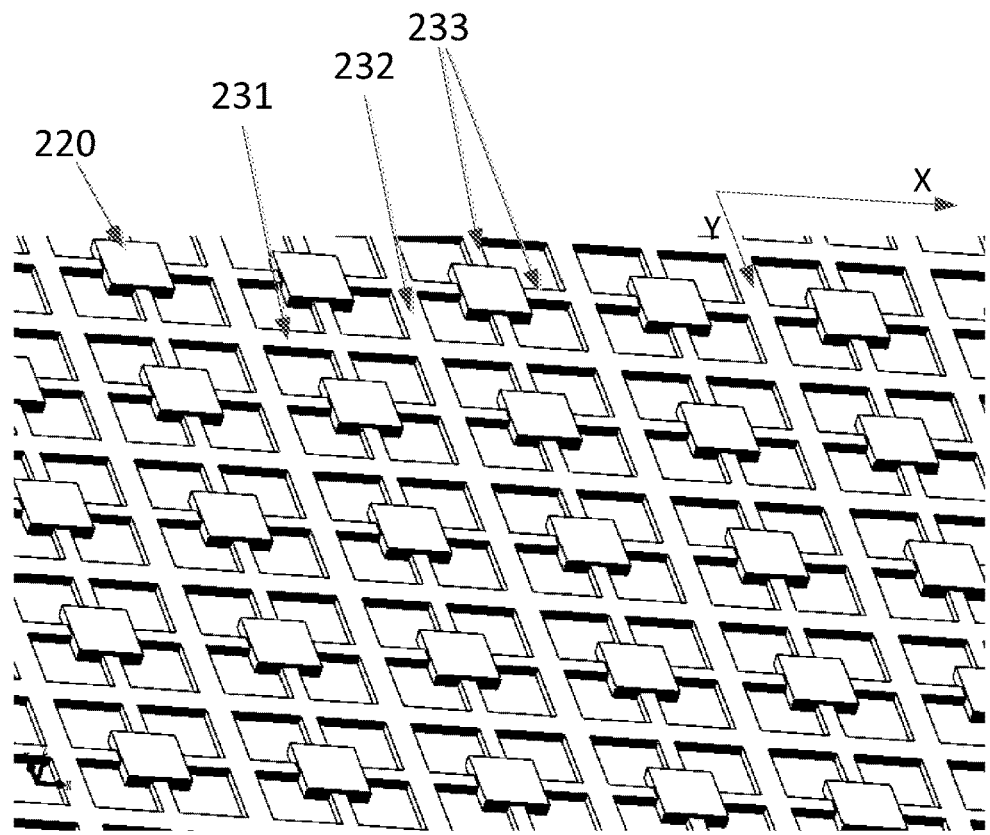
FIG. 7 is a perspective schematic diagram of the optical adhesive layer shown in FIG. 3.
FIG. 8 is a flow chart showing a preparing method for the optical adhesive layer according to an embodiment of the disclosure.
FIG. 9 is another flow chart showing a preparing method for the optical adhesive layer according to an embodiment of the disclosure.

In the optical adhesive layer according to the embodiment of the disclosure, as shown in FIGS. 3 and 7, the connection ribs 230 include: a plurality of first ribs 231 disposed along the first direction X, and a plurality of second ribs 232 disposed along the second direction Y; wherein both ends of each of the first ribs 231 and both ends of each of the second ribs 232 are connected to the edge region 210, respectively, a plurality of the first ribs 231 are intersected with a plurality of the second ribs 232 to form a plurality of quadrilateral regions 234, wherein each of the quadrilateral regions 234 is provided with a corresponding block region 220; and third ribs 233 disposed in each of the quadrilateral regions for connecting the block regions 220 with the first ribs 231 and the second ribs 232 forming the quadrilateral regions 234.

Optionally, in an embodiment of the present disclosure, the third ribs 233 connect the block region 220 and the second ribs 232 along the first direction X, and connect the block region 220 and the first ribs 231 along the second direction Y.

In an embodiment of the present disclosure, optionally, the first direction X is perpendicular to the second direction Y, and the first direction X and the second direction Y are two edge directions of the display device (also two edge directions of the display substrate 100), respectively. When the display device is stretched, the stretching is usually performed along the first direction X and/or the second direction Y. On the basis of this structure, by means of the plurality of first ribs 231 disposed along the first direction X, when the stretching is performed in the first direction X, the plurality of first ribs 231 can ensure that the tension force acting on the edge region 210 in the first direction X can be quickly transmitted to the interior of the display substrate 100 to eliminate the excessively concentrated stress on the edge region 210. In addition, by means of the plurality of second ribs 232 disposed along a direction (the second direction Y) perpendicular to the stretching direction, it can help to make the stretching force on the display device to advance in general along the stretching direction, rather than concentrate the tension force on the first ribs 231 only.

In an embodiment of the present disclosure, the third ribs 233 enable the block region 220 to be connected to the first ribs 231 and the second ribs 232, and each of the third ribs 233 is disposed in the quadrilateral region 234 surrounded by the first ribs 231 and the second ribs 232 to connect the block region 220, and to further ensure that the tension force on the first ribs 231 and the second ribs 232 can be uniformly transmitted to the interior of the optical adhesive layer.

In the above implementation structure, the first ribs 231, the second ribs 232 and the third ribs 233 are intersected with each other, and distributed in a net form in the hollow portion formed by the edge region 210 of the optical adhesive layer 200, so as to reduce limitations by the optical adhesive layer to the connection regions 112 of the display substrate 100, and transmit the tension force on the peripheral non-display region 114 of the display substrate 100 to each of the islands 111 uniformly, thereby ensuring uniform stress on the islands 111, and avoiding the problem that fracture caused by stress concentration occurs at an edge during stretching, while the interior does not deform.

In addition, the first ribs 231, the second ribs 232 and the third ribs 233 intersected with each other to form a net structure can ensure that the connection regions 112 of the display substrate 100 are not restricted by the optical adhesive layer, and have a certain deformation amount in a third direction Z perpendicular to the first direction X and the second direction Y, thereby greatly reducing the stress on the edge of the stretched unit white increasing the stretching amount.

In an embodiment of the present disclosure, optionally, as shown in FIGS. 3 and 7, the third ribs 233 connect the block region 220 and the second ribs 232 along the first direction X, and connect the block region 220 and the first ribs 231 along the second direction Y. In this manner, the third ribs 233 located in the quadrilateral region 234 surrounded by the first ribs 231 and the second ribs 232 form a cross shape, wherein the block region 220 is disposed at the center of the crossed third ribs 233, and one end of each of the crossed third ribs 233 away from the block region 220 is connected to the first rib 231 or the second rib 232.

In an embodiment of the present disclosure, optionally, at least a part of the third ribs 233 extend to connect with the edge region 210 in the quadrilateral region 234 adjacent to the edge region 210.

In addition, in the whole hollow portion, in the plurality of quadrilateral regions 234 arranged in one row along the first direction X, parts of the third ribs 233 along the first direction X are located on a straight line; and in the plurality of quadrilateral regions 234 arranged in one column along the second direction Y, parts of the third ribs 233 arranged along the second direction Y are located on a straight line.

With the above implementation structure, the third ribs 233 surrounding the block region 220 are symmetrically distributed to help the uniform transmission of force.

It should be noted that, in order to form the net structure of the connection ribs 230, the first rib 231 and the second rib 232 each should have a width smaller than a width between the islands 111.

In an embodiment of the present disclosure, optionally, the first rib 231, the second rib 232 and the third rib 233 each have a quadrilateral cross section, and a cross section width of the third rib 233 is smaller than or equal to that of the first rib 231 or the second rib 232. The term "cross section width" here refers to a width dimension of each rib in a direction perpendicular to its extending direction in the top view of FIG. 3, i.e., the dimension of the first rib 231 in the second direction Y, the dimension of the second rib 232 in the first direction X, and the dimension of the third rib 233 in the first direction X or the second direction Y.

In the optical adhesive layer according to the embodiment of the disclosure, the block region 220 has a viscosity higher than the connection rib 230. Optionally, the connector rib 230 may be free of viscosity. With the connector rib 230 free of viscosity, or having a viscosity lower than the block region 220, no adhesive force is present between the connection rib 230 and the connection region 112 of the display substrate 100, or the adhesive force between the connection rib 230 and the connection region 112 is weaker than that between the block region 220 and the island 111, so that the connection region 112 on the display substrate 100 for connecting the islands 111 is prevented from contacting the connection rib 230 in a lower layer, thereby achieving the purpose of facilitating free extension and retraction of the connection region in the XY horizontal plane, and ensuring a deformation space for the connection region in the Z axis direction to greatly release the stress.

As shown in FIGS. 5 and 6, optionally, a cover material layer having a viscosity lower than the block region 220 may be provided on the end face of the connection rib 230 facing the third direction Z, and by providing the cover material layer, no adhesive force is present between the connection rib 230 and the connection region 112 of the display substrate 100, or the adhesive force between the connection rib 230 and the connection region 112 is weaker than that between the block region 220 and the island 111.

It should be noted that, since the edge region 210 of the optical adhesive layer needs to be attached to the peripheral non-display region 114 of the display substrate 100, the viscosity of the edge region 210 of the optical adhesive layer is required to be the same as that of the block region 220, and the following requirements on the material and the preparing method of the block region 220 of the optical adhesive layer are also applicable to the edge region 210, and thus are not repeated.

Specifically, in an embodiment of the present disclosure, optionally, the optical adhesive layer with the above structure may be prepared by a printing process. When the optical adhesive layer is prepared by printing, different viscosities of the connection rib 230 and the block region 220 may be obtained by making the printing material of the connection rib 230 different from that of the block region 220, thereby meeting the requirement of lower viscosity or no viscosity on the connection rib.

In another embodiment, optionally, the optical adhesive layer with the above implementation structure may be prepared by patterning a film body with a certain thickness provided in advance by irradiating with UV light. When the optical adhesive layer is prepared by this method, the requirement of low viscosity or no viscosity on the connection rib may be further met by depositing an ultrathin cover material layer on the connection rib 230. Optionally, the cover material layer may be silicon dioxide or silicon oxynitride.

Further, an elastic modulus of the connection rib 230 is required to be at least at the same order as or greater than an elastic modulus of the backing film layer 300.

Specifically, during preparation of the optical adhesive layer, the above requirement on the elastic modulus of the connection rib 230 may be met by selecting the material of the optical adhesive layer.

When applied to bonding the display substrate and the backing film, the optical adhesive layer according to the embodiment of the present disclosure can make the tension force on the edge quickly transmitted to the interior of the display substrate by means of the ribs in the stretching direction, and thus eliminate the excessively concentrated stress on the edge; the tension force may be advanced along the stretching direction in general by means of the ribs in a direction perpendicular to the stretching direction without concentrating the tension force only near the ribs along the stretching direction. By forming a bonding region with the island of the display substrate in the block region, and providing the connection ribs around the bonding region, it can ensure that the respective islands experience a more uniform stress upon stretching of the surrounding ribs; and by designing the block region for bonding to a boss, and designing the peripheral connection ribs to have a height lower than this block region, it can ensure that the connection region on the display substrate for connecting the islands is prevented from contacting the connection rib in a lower layer, so as to facilitate free extension and retraction of the connection region in the XY horizontal plane, and ensure a deformation space for the connection region in the Z axis direction, so as to greatly release the stress, increase a stretching amount of the stretched structure, avoid restricting free extension and retraction of the connection region when an optical adhesive layer in the conventional technology is bonded to the connection region, while eliminating break and fracture of the connection region due to excessive local deformation caused by stretching. In addition, by forming a hollow-out region between the connection ribs, it may ensure that the edges and the connection regions of the display substrate are not restricted by the optical adhesive layer, so that a certain deformation amount is present in the Z axis direction, thereby greatly reducing the stress on the edge of the stretched unit while increasing the stretching amount.

In an embodiment of the present disclosure, there is further provided a stretchable display device, wherein the stretchable display device includes an optical adhesive layer having the above structure.

As shown in FIGS. 1 to 7, the stretchable display device further includes a display substrate 100 and a backing film layer 300; and an optical adhesive layer 200 connects the display substrate 100 and the backing film layer 300.

The display substrate 100 includes a plurality of islands 111 distributed at intervals and each provided with a pixel unit; the islands 111 are attached to the block regions 220 in a one-to-one correspondence manner.

Optionally, an orthographic projection of the block region 220 on the island 111 is located within the island 111.

Optionally, the display substrate 100 further includes connection regions 112 connecting the plurality of islands 111, wherein an orthographic projection of each connection region 112 in a plane of the optical adhesive layer 200 is located on the connection rib 230, and a gap is present between the connection region 112 and the connection rib 230.

For the specific structure of the stretchable display device using the optical adhesive layer according to the embodiment of the present disclosure, reference may be made to FIGS. 1 to 7 and the above detailed description, and thus is not repeated here.

In another aspect of the embodiment of the present disclosure, there is further provided a preparing method for an optical adhesive layer, wherein the method includes:

preparing the optical adhesive layer by a printing process; or providing a film body with a preset thickness, and patterning the film body to form the optical adhesive layer.

Optionally, preparing the optical adhesive layer by patterning the film body includes:

patterning the film body by irradiating with UV tight to form the optical adhesive layer.

Those skilled in the art will know about the specific process of preparing the optical adhesive layer with the above structure by printing, and specific implementations of patterning the film body with a preset thickness by irradiating with UV light, which are not detailed here.

Optionally, when the optical adhesive layer is prepared by printing, the printing material of the connection rib is different from that of the block region and the edge region, so as to meet the requirement of lower viscosity or no viscosity on the connection rib.

Optionally, when the film body is patterned by irradiating with UV light to form the optical adhesive layer, after fabricating the optical adhesive layer with the above structure, the method further includes:

depositing a cover material layer on the connection rib by a deposition manner.

By depositing the cover material layer, the requirement of lower viscosity or no viscosity on the connection rib is met.

Optionally, the cover material layer may be silicon dioxide or silicon oxynitride.

It should be noted that in the optical adhesive layer with the deposited cover material layer, deposited cover material layer may be regarded as a part of the connection rib, and a height of the connection rib and the block region after the cover material is deposited also needs to satisfy the implementation structure shown in FIGS. 5 and 6.

In the stretchable display device adopting the optical adhesive layer according to the embodiment of the present disclosure, by improving the structure of the optical adhesive layer, it can ensure that the display device receives a relatively even stretching force both inside and outside when being stretched, and the phenomenon that fracture caused by stress concentration occurs at an edge of a conventional stretchable display device while the interior does not deform obviously is eliminated, thereby finally improving the stretching amount macroscopically demonstrated by the whole display device by making the whole display device stretchable.

In addition, according to the above detailed description, those skilled in the art shall understand the specific implementation structure of the sequential control chip display device including the above functions, which will not be described in detail herein. The foregoing are preferred implementations of the present disclosure, and it should be noted that modifications and refinements may be made by those skilled in the art without departing from the principles of the disclosure and these modifications and refinements should be considered as within the scope of the disclosure.

What is claimed is:

1. An optical adhesive layer, comprising:
   an edge region enclosing a hollow portion;
   a plurality of block regions distributed in the hollow portion along a first direction and a second direction; and
   connection ribs connecting the block regions to the edge region, wherein the connection ribs are distributed in the hollow portion in a net form, wherein
   end faces of the edge region and the block region facing a third direction are both located in a first plane, and an end face of the connection rib facing the third direction is located in a second plane,
   wherein the first plane protrudes from the second plane, and the third direction is perpendicular to the first direction and the second direction.

2. The optical adhesive layer of the claim 1 wherein end faces of the edge region, the block region and the connection rib facing a fourth direction are all located in a third plane; wherein the fourth direction is opposite to the third direction.

3. The optical adhesive layer of the claim 2, wherein a distance between the second plane and the third plane is in the range of ½ to ⅘ of a distance between the first plane and the third plane.

4. The optical adhesive layer of the claim 1, wherein the connection ribs include:
   a plurality of first ribs disposed along the first direction, and a plurality of second ribs disposed along the second direction;
   wherein both ends of each of the first ribs and both ends of each of the second ribs are connected to the edge region, respectively, a plurality of the first ribs are intersected with a plurality of the second ribs to form a plurality of quadrilateral regions, wherein each of the quadrilateral regions is provided with a corresponding one of the block regions; and
   third ribs disposed in each of the quadrilateral regions for connecting the block regions with the first ribs and the second ribs that form the quadrilateral regions.

5. The optical adhesive layer of the claim 4, wherein the ribs connect the block region and the second ribs along the first direction, and connect the block region and the first ribs along the second direction.

6. The optical adhesive layer of the claim 4, wherein at least a part of the third ribs extend to connect with the edge region in the quadrilateral region adjacent to the edge region.

7. The optical adhesive layer of the claim 4, wherein the first rib, the second rib and the third rib each have a quadrilateral cross section, and a cross section width of the third rib is smaller than or equal to that of the first rib or the second rib.

8. The optical adhesive layer of the claim 1, wherein the block region has a viscosity higher than the connection rib.

9. The optical adhesive layer of the claim 1, wherein a cover material layer having a viscosity lower than the block region is provided on the end face of the connection rib facing the third direction.

10. A stretchable display device, characterized in comprising the optical adhesive layer according to claim 1.

11. The stretchable display device of claim 10, wherein the stretchable display device further includes a display substrate and a backing film layer; and the optical adhesive connects the display substrate and the backing film layer; wherein the display substrate includes a plurality of islands distributed at intervals and each provided with a pixel unit; and the islands are attached to the block regions in a one-to-one correspondence manner.

12. The stretchable display device of claim 11, wherein an orthographic projection on the block region on the island is located within the island.

13. The stretchable display device of claim 11, wherein the display substrate further includes connection regions connecting the plurality of islands, wherein an orthographic projection of each connection region in a plane of the optical adhesive layer is located on the connection rib, and a gap is present between the connection region and the connection rib.

14. A preparing method for the optical adhesive layer of claim 1, wherein the method includes:
- preparing the optical adhesive layer by a printing process; or
- providing a film body with a preset thickness, and patterning the film body to form the optical adhesive layer.

15. The preparing method of claim 14, wherein the step of patterning the film body to form the optical adhesive layer includes:
- patterning the film body by irradiating with UV light to form the optical adhesive layer.

\* \* \* \* \*